(12) United States Patent
Loh et al.

(10) Patent No.: US 7,379,281 B2
(45) Date of Patent: May 27, 2008

(54) BIAS FOR ELECTROSTATIC DISCHARGE PROTECTION

(75) Inventors: William M. Loh, Fremont, CA (US); Minxuan Liu, San Jose, CA (US); Jau-Wen Chen, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 192 days.

(21) Appl. No.: 11/287,615

(22) Filed: Nov. 28, 2005

(65) Prior Publication Data

US 2007/0121262 A1    May 31, 2007

(51) Int. Cl.
*H02H 9/00* (2006.01)
(52) U.S. Cl. ....................................... 361/56
(58) Field of Classification Search ............ 361/56
See application file for complete search history.

(56) References Cited

U.S. PATENT DOCUMENTS 6,724,592 B1 * 4/2004 Tong et al. ............... 361/56

OTHER PUBLICATIONS

Charvaka Duvvury et al, *Substrate Pump NMOS for ESD Protection Applications*, ESD Association, 2000, no month.

* cited by examiner

*Primary Examiner*—Ronald W. Leja
(74) *Attorney, Agent, or Firm*—Luedeka, Neely & Graham

(57) ABSTRACT

An electrostatic discharge protection circuit adapted to reduce an electrostatic discharge event on a line of an integrated circuit. The protection circuit includes an NMOS transistor having a source contact that is electrically connected to the line. A drain contact is electrically connected to a logical low voltage, and a gate contact is also electrically connected to the logical low voltage, through a resistor. A substrate bias pump is electrically connected to a back gate of the NMOS transistor, where the bias pump provides a steady state direct current negative bias during normal operation of the integrated circuit when there is no electrostatic discharge event.

1 Claim, 1 Drawing Sheet

US 7,379,281 B2

BIAS FOR ELECTROSTATIC DISCHARGE PROTECTION

FIELD

This invention relates to the field of integrated circuit fabrication. More particularly, this invention relates to a design for a circuit to protect the circuit from electrostatic discharge.

BACKGROUND

Most integrated circuits are designed to carry a given, relatively small amount of current. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

When a current flow that is larger than that for which the integrated circuit is designed is passed through the circuit, the current flow tends to destroy various elements of the integrated circuit, such as gate dielectrics and junctions, rendering it either unstable or inoperable. One source of excessive current flow is called electrostatic discharge. Electrostatic discharge is a general condition where a charge imbalance builds up over a period of time, caused by one or more of a variety of conditions, and then is suddenly released. The current flow, although extremely brief, can be quite high. Electrostatic discharge is not an uncommon occurrence in circuits. If unaccounted for in the design of integrated circuits, electrostatic discharge can potentially be a major cause of failure for integrated circuits.

Various methods and structures for the shunting of electrostatic discharge have been proposed. With reference now to FIG. 1 there is depicted a circuit diagram 10 for a prior art grounded gate N channel MOSFET 12. Such a device is typically used for arresting electrostatic discharge in an integrated circuit. The MOSFET 12 has a source that is tied to a voltage source, such as a $V_{DD}$, and a drain that is tied to a voltage ground, such as a $V_{SS}$. The gate of the MOSFET 12 is also tied to the ground, through a resistor 14. With the gate coupled to ground in this manner, the circuit 10 is a type of GGNMOS, or grounded gate N type metal-oxide-semiconductor field effect transistor.

During what is commonly known as a snapback, the parasitic bipolar transistor associated with the NMOS will conduct a much higher current when the NMOS drain node reaches a trigger voltage, V_trigger. This high current causes a reduction of the drain voltage to the holding voltage, V_hold. This lowering of the holding voltage limits the voltage that is seen by the downstream functional device, thus protecting the downstream device from an electrostatic discharge. The parasitic capacitance associated with this GGNMOS 10 is usually around a few hundred femtofarads.

Unfortunately, this capacitance is unacceptably high for most high frequency and high speed applications. The problem with the circuit of FIG. 1 is that the nodal capacitance is higher than about one hundred femtofarads. Radio frequency and other high speed applications suffer performance degradations with this degree of capacitance, because the relatively high capacitance of the circuit slows its switching speed to an unacceptably low rate.

Radio frequency and higher speed applications demand parasitic capacitance of less than about one hundred femtofarads. Thus, although the electrostatic discharge handling performance of the circuit 10 depicted in FIG. 1 may be adequate, the circuit 10 cannot be used in high speed applications.

What is needed, therefore, is a system for handling electrostatic discharge in integrated circuits that overcomes problems such as those described above, at least in part.

SUMMARY

The above and other needs are met by an electrostatic discharge protection circuit adapted to reduce an electrostatic discharge event on a line of an integrated circuit. The protection circuit includes an NMOS transistor having a source contact that is electrically connected to the line. A drain contact is electrically connected to a logical low voltage, and a gate contact is also electrically connected to the logical low voltage, through a resistor. A substrate bias pump is electrically connected to a back gate of the NMOS transistor, where the bias pump provides a steady state direct current negative bias during normal operation of the integrated circuit when there is no electrostatic discharge event.

Thus, the preferred embodiments of the invention enable the use of a GGNMOS type device for high speed applications, by reducing the capacitance of the GGNMOS with the substrate bias pump, and thereby increasing the switching speed of the device. By using GGNMOS library cells and methodologies, development and characterization of alternate devices does not need to be performed, resulting in a lower cost and risk in the design, fabrication, and implementation of the integrated circuits in which such devices are used.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
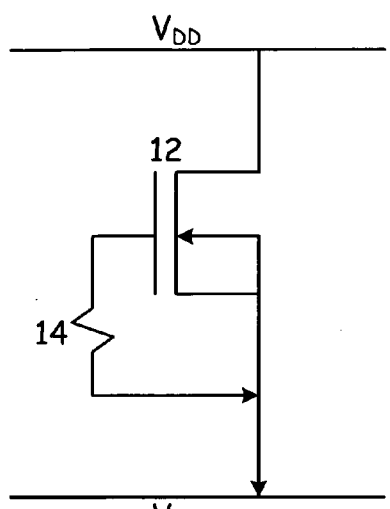
FIG. 1 is a circuit diagram for a prior art grounded gate N channel MOSFET (GGNMOS).
Figure 2:
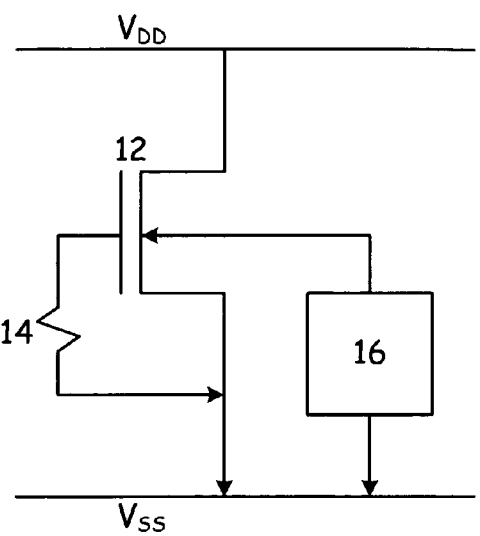
FIG. 2 is a circuit diagram for a grounded gate N channel MOSFET with a back gate bias, according to a preferred embodiment of the present invention.

With reference now to FIG. 2 there is depicted a circuit diagram 10 for a grounded gate N channel MOSFET 12 with a back gate bias, according to a preferred embodiment of the present invention. As depicted in FIG. 2, a charge-pump like circuit 16 is electrically tied to the MOSFET 12.

The present invention adds the bias circuit 16 to bias the substrate node, or the back gate, of the NMOS 12. During normal system operation, the bias circuit 16 lowers the capacitance of the circuit 10, thereby increasing the switching speed of the circuit 10, such that the GGNMOS can be used for radio frequency and other high speed applications. In the present invention the bias circuit 16 preferably provides a negative bias to the back gate, which bias is provided as a steady state direct current. There are many well-known back gate bias pumping circuits 16 that can be used. These pumping circuits 16 are typically used in the prior art only during the electrostatic discharge event itself, and not continually during the normal operation of the circuit 10. Further, prior art biases for electrostatic discharge protection are positive, and the present invention uses a negative back gate bias.

Thus, there are three major distinctions between the present invention and the prior art, being: (1) the bias applied in the present invention is negative, not positive; (2) the substrate bias is applied as a steady state direct current in the present invention, and not as a pulse; and (3) the bias is applied during normal system operation in the present invention, and not just during the electrostatic discharge event.

In the present invention, the capacitance goes from the drain node to ground. The substrate bias causes a higher threshold voltage (i.e. it makes the formation of inversion charge in the NMOS channel harder) and also a thicker space charge layer. As a result, the capacitance scales approximately as the inverse of the square-root of substrate bias voltage.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. An electrostatic discharge protection circuit adapted to reduce an electrostatic discharge event on a line of an integrated circuit, the protection circuit comprising:

an NMOS transistor having,
  a source contact electrically connected to the line,
  a drain contact electrically connected to a logical low voltage, and
  a gate contact electrically connected only to a resistor, the resistor electrically connected to the logical low, and
a substrate bias pump electrically connected to a back gate of the NMOS transistor, the bias pump providing a steady state direct current negative bias during normal operation of the integrated circuit when there is no electrostatic discharge event.

* * * * *